(12) United States Patent
Hung

(10) Patent No.: US 8,525,603 B2
(45) Date of Patent: Sep. 3, 2013

(54) OSCILLATING SIGNAL GENERATING DEVICE AND RELATED METHOD

(75) Inventor: Shuo-Chun Hung, Taichung (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 0 days.

(21) Appl. No.: 12/890,714

(22) Filed: Sep. 27, 2010

(65) Prior Publication Data
US 2011/0241791 A1    Oct. 6, 2011

(30) Foreign Application Priority Data

Mar. 31, 2010    (TW) .............................. 99109882 A

(51) Int. Cl.
*H03B 5/36*    (2006.01)
(52) U.S. Cl.
USPC ....................... 331/116 FE; 331/173; 331/183
(58) Field of Classification Search
USPC ................ 331/116 R, 116 FE, 158, 160, 165, 331/172, 185
See application file for complete search history.

(56) References Cited

U.S. PATENT DOCUMENTS

| | | | | |
|---|---|---|---|---|
| 4,117,421 A | * | 9/1978 | Wiesner | 331/116 FE |
| 4,704,587 A | * | 11/1987 | Ouyang et al. | 331/116 FE |
| 5,557,243 A | * | 9/1996 | Ho | 331/158 |
| 5,900,787 A | * | 5/1999 | Yoshimura | 331/116 FE |
| 6,160,457 A | * | 12/2000 | Wu | 331/116 FE |
| 6,166,609 A | * | 12/2000 | Nakamiya et al. | 331/116 FE |
| 7,961,060 B1 | * | 6/2011 | McMenamy et al. | 331/186 |
| 2005/0219004 A1 | * | 10/2005 | Pan | 331/158 |

FOREIGN PATENT DOCUMENTS

| TW | 200524285 | 7/2005 |
|---|---|---|
| TW | 200635205 | 10/2006 |

OTHER PUBLICATIONS

Fairchild Semiconductor Corporation, "74VHC393 Dual 4-Bit Binary Counter", Dec. 2007.*

* cited by examiner

*Primary Examiner* — Ryan Johnson
(74) *Attorney, Agent, or Firm* — Winston Hsu; Scott Margo

(57) ABSTRACT

An oscillating signal generating device includes an oscillating circuit and a control circuit. The oscillating circuit includes: a resonator having a first terminal and a second terminal for generating an oscillating signal, a resistive element having a first terminal coupled to the first terminal of the resonator, and a second terminal coupled to the second terminal of the resonator, and an oscillating start-up circuit having an input terminal coupled to the first terminal of the resonator and an output terminal coupled to the second terminal of the resonator. The control circuit generates a control signal to change the oscillating start-up circuit into a disable mode from an enable mode when the oscillating circuit generates an oscillating output signal under an operation mode, and outputs the oscillating signal generated by the resonator as the oscillating output signal of the oscillating circuit.

12 Claims, 8 Drawing Sheets

OSCILLATING SIGNAL GENERATING DEVICE AND RELATED METHOD

BACKGROUND OF THE INVENTION

1. Field of the Invention

The present invention relates to an oscillating signal generating device and method thereof, and more particularly to an oscillating signal generating device with low power consumption, and a method thereof.

2. Description of the Prior Art

Normally, a crystal resonator is employed to generate a reference clock signal with an accurate oscillating frequency in the field of clock signal generators, which means the crystal resonator exists in most of the electronic device. The crystal resonator is always designed to have the characteristics of low transconductance (i.e., gm) and low current consumption in the advanced manufacturing process in order to prolong the standby time of the electronic device. By doing this, the size of the crystal resonator is enlarged and the stability of the crystal resonator is worsened. More specifically, for the crystal resonator having the characteristics of low transconductance and low current consumption, the crystal resonator may be unable to start oscillating when the crystal resonator is under a high temperature and lower supply voltage conditions. It should be noted that the crystal resonator may generate the original reference clock signal for all other clock signals having different frequencies in the electronic device, meaning the conventional electronic device may crash under some circumstances, such as when the above-mentioned high temperature and lower supply voltage conditions occur. Therefore, providing an efficient and convenient way to reduce power consumption, while also prolonging the standby time and improving the stability of the electronic device, is a significant concern in the field.

SUMMARY OF THE INVENTION

One of the objectives of the present invention is therefore to provide an oscillating signal generating device with low power consumption, and a method thereof.

According to a first embodiment of the present invention, an oscillating signal generating device is disclosed. The oscillating signal generating device comprises an oscillating circuit and a control circuit. The oscillating circuit comprises a crystal oscillator, a resistor, and an oscillating start-up circuit. The crystal resonator has a first terminal and a second terminal, for generating an oscillating signal. The resistor has a first terminal coupled to the first terminal of the crystal oscillator, and a second terminal coupled to the second terminal of the crystal oscillator. The oscillating start-up circuit has an input terminal coupled to the first terminal of the crystal oscillator, and an output terminal coupled to the second terminal of the crystal oscillator. The control circuit is coupled to the crystal resonator for generating a control signal to change the oscillating start-up circuit into a disable mode from an enable mode when the oscillating circuit generates an oscillating output signal under an operation mode, and outputting the oscillating signal generated by the crystal resonator as the oscillating output signal of the oscillating circuit.

According to a second embodiment of the present invention, an oscillating signal generating method is disclosed. The oscillating signal generating method is used for controlling an oscillating circuit, wherein the oscillating circuit comprises: a crystal resonator having a first terminal and a second terminal, for generating an oscillating signal; a resistor having a first terminal coupled to the first terminal of the crystal oscillator, and a second terminal coupled to the second terminal of the crystal oscillator; and an oscillating start-up circuit having an input terminal coupled to the first terminal of the crystal oscillator, and an output terminal coupled to the second terminal of the crystal oscillator. The oscillating signal generating method comprises: generating a control signal to change the oscillating start-up circuit into a disable mode from an enable mode when the oscillating circuit generates an oscillating output signal under an operation mode; and outputting the oscillating signal generated by the crystal resonator as the oscillating output signal of the oscillating circuit when the oscillating start-up circuit is under the disable mode.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
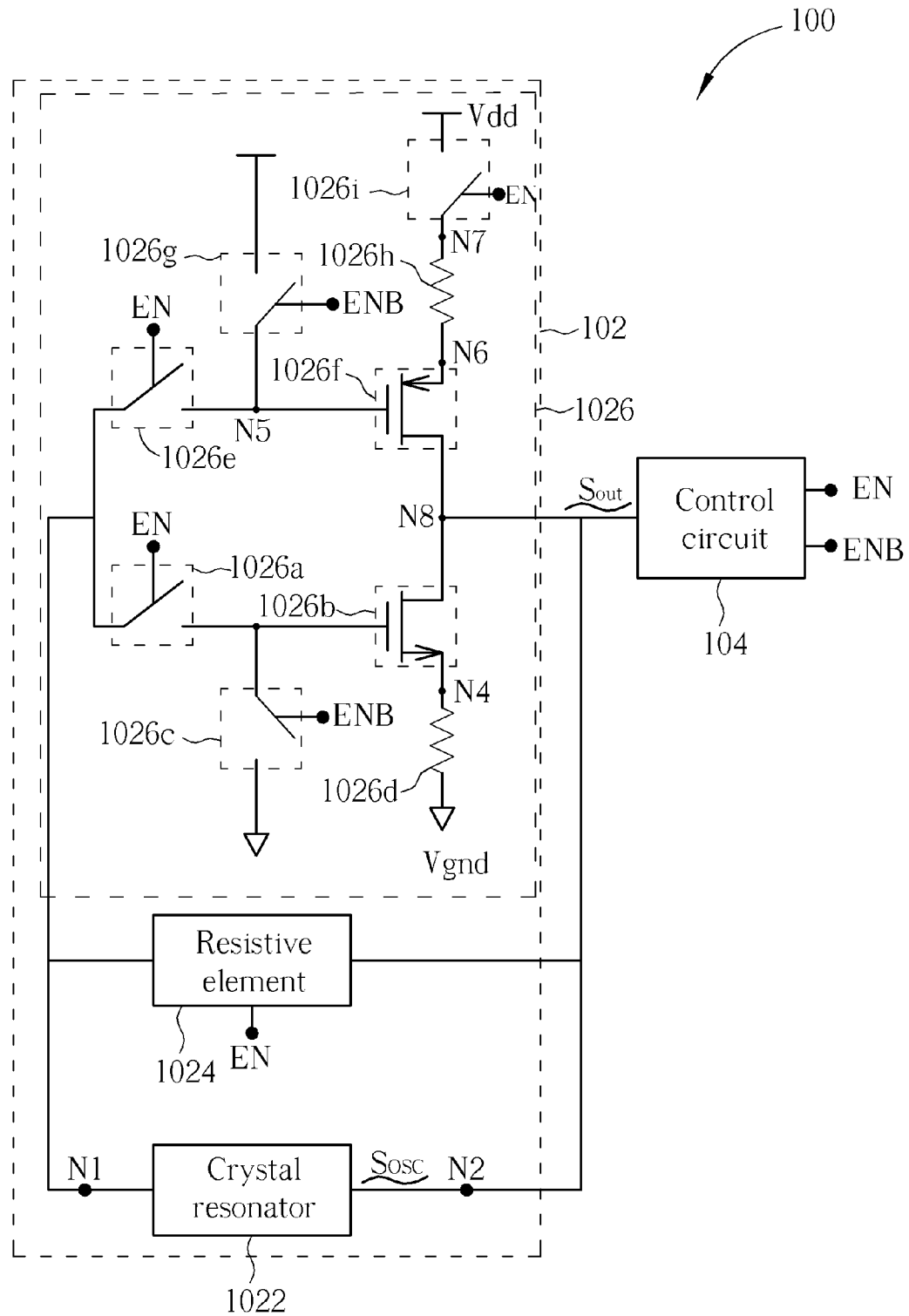
FIG. 1A is a diagram illustrating an oscillating signal generating device according to an embodiment of the present invention.

Please refer to FIG. 1A. FIG. 1A is a diagram illustrating an oscillating signal generating device 100 according to an embodiment of the present invention. The oscillating signal generating device 100 comprises an oscillating circuit 102 and a control circuit 104. The oscillating circuit 102 comprises a crystal resonator 1022, a resistor 1024, and an inverter 1026. The crystal resonator 1022 has a first terminal N1 and a second terminal N2, and the crystal resonator 1022 generates an oscillating signal Sosc. The resistor 1024 has a first terminal coupled to the first terminal N1 of the crystal resonator 1022, and a second terminal coupled to the second terminal N2 of the crystal resonator 1022. The inverter 1026 has an input terminal coupled to the first terminal N1 of the crystal resonator 1022, and an output terminal coupled to the second terminal N2 of the crystal resonator 1022. The control circuit 104 is coupled to the crystal resonator 1022 for generating a control signal EN, ENB to change the inverter 1026 into a disable mode from an enable mode when the oscillating circuit 102 generates an oscillating output signal Sout under an operation mode. The control circuit 104 further outputs the oscillating signal Sosc generated by the crystal resonator 1022 as the oscillating output signal Sout of the oscillating circuit 102.

Please note that the inverter 1026 operates between a supply voltage Vdd and a ground voltage Vgnd. When the oscillating circuit 102 is activated, i.e., when the supply voltage Vdd and the ground voltage Vgnd are coupled to the power terminal and the ground terminal of the inverter 1026 respectively, the inverter 1026, the resistor 1024, and the crystal resonator 1022 are arranged to compose a positive feedback circuit, wherein the inverter 1026 provides a transconductance gain for the positive feedback circuit, and the crystal resonator 1022 provides an adequate phase delay such that the positive feedback circuit conforms to the Barkhausen law. It should be noted that, in another embodiment of the present invention, the inverter 1026 is an amplifier. When the oscillating circuit 102 comprised of the crystal resonator 1022, the resistor 1024, and the inverter 1026 conforms to the Barkhausen law, the oscillating circuit 102 will start to oscillate for generating the oscillating output signal Sout, wherein the oscillating output signal Sout oscillates between the supply voltage Vdd and the ground voltage Vgnd. In addition, the oscillating output signal Sout has a specific oscillating frequency, such as 23 KHz. It should be noted that the specific oscillating frequency of the crystal resonator 1022 depends on the device characteristic of the crystal resonator 1022. Furthermore, when the oscillating circuit 102 is oscillated to generate the oscillating signal Sout, certain energy is stored in the crystal resonator 1022 since the crystal resonator 1022 can be represented by an equivalent inductor in conjunction with an equivalent capacitor and an equivalent parasitic resistor (not shown). When the quality factor, i.e., the Q value, of the crystal resonator 1022 is larger, the resistance of the equivalent parasitic resistor is smaller, which means the energy (stored in the crystal resonator 1022) that is consumed by the parasitic resistor is reduced. In other words, when the quality factor, i.e., the Q value, of the crystal resonator 1022 is larger, the resonance of the crystal resonator 1022 may last for a longer time if no external power is supplied to the crystal resonator 1022. Therefore, one of the features of the present invention is to generate the control signals EN, ENB to change the inverter 1026 into the disable mode from the enable when the oscillating circuit 102 generates the oscillating output signal Sout under the operation mode, and to output an resonant signal (i.e., the oscillating signal Sosc) generated by the crystal resonator 1022 as the oscillating output signal Sout of the oscillating circuit 102. Accordingly, no current is consumed by the inverter 1026 when the oscillating circuit 102 is under the operation mode.

Please note that a detailed circuit of the inverter 1026 is also shown in FIG. 1A to more clearly illustrate the features of the present invention; however, this is not a limitation of the present invention. The inverter 1026 comprises a first switch 1026a, a first transistor 1026b, a second switch 1026c, a first resistor 1026d, a third switch 1026e, a second transistor 1026f, a fourth switch 1026g, a second resistor 1026h, and a fifth switch 1026i. The first switch 1026a comprises a first terminal coupled to the first terminal N1 of the crystal resonator 1022, and a control terminal coupled to the first control signal EN. The first transistor 1026b comprises a control terminal N3 coupled to a second terminal N3 of the first switch 1026a. The second switch 1026c has a first terminal coupled to a control terminal N3 of the first transistor 1026b, a second terminal coupled to a first supply voltage (i.e., the ground voltage Vgnd), and a control terminal coupled to the second control signal ENB. The first resistor 1026d comprises a first terminal N4 coupled to a first output terminal (i.e., the source terminal) of the first transistor 1026b, and a second terminal coupled to the ground voltage. The third switch 1026e comprises a first terminal coupled to the first terminal N1 of the crystal resonator 1022, and a control terminal coupled to the first control signal EN. The second transistor 1026f comprises a control terminal N5 coupled to a second terminal of the third switch 1026e. The fourth switch 1026g has a first terminal coupled to the control terminal N5 of the second transistor 1026f, a second terminal coupled to a second supply voltage (i.e., the supply voltage Vdd), and a control terminal coupled to the second control signal ENB. The second resistor 1026h has a first terminal N6 coupled to a first output terminal (i.e., the source terminal) of the second transistor 1026f. The fifth switch 1026i comprises a first terminal N7 coupled to a second terminal of the second resistor 1026h, a second terminal coupled to the supply voltage Vdd, and a control terminal coupled to the first control signal EN. Furthermore, a second output terminal (i.e., the drain terminal) N8 of the first transistor 1026b is coupled to a second output terminal (i.e., the drain terminal) of the second transistor 1026f, and the second terminal N2 of the crystal resonator 1022.

According to the inverter 1026 of FIG. 1A, when the oscillating circuit 102 operates under the operation mode and the inverter 1026 operates under the enable mode, the first control signal EN generated by the control circuit 104 is set to close (i.e., switch on) the first switch 1026a, the third switch 1026e, and the fifth switch 1026i, and the second control signal ENB is set to open (i.e., switch off) the second switch 1026c and fourth switch 1026g. When the oscillating circuit 102 operates under the operation mode and the inverter 1026 operates under the disable mode, the first control signal EN generated by the control circuit 104 is set to open the first switch 1026a, the third switch 1026e, and the fifth switch 1026i such that a conducting path between the oscillating start-up circuit and the first supply voltage or between the inverter 1026 and the supply voltage Vdd is an open-circuit, and the second control signal ENB is set to close the second switch 1026c and the fourth switch 1026g. Those skilled in the art may understand that installing the fifth switch 1026i between the second terminal of the first resistor 1026d and the ground voltage Vgnd, or installing the fifth switch 1026i on any position between the path starting from the supply voltage Vdd to the ground voltage Vgnd via the first transistor 1026b and the second transistor 1026f also belongs to the scope of the present invention. Therefore, the inverter 1026 does not consume any power when the oscillating circuit 102 operates under the operation mode and the inverter 1026 operates under the disable mode since the conducting path between the supply voltage Vdd and the ground voltage Vgnd of the inverter 1026 is open circuit.

Furthermore, to further reduce the power consumption of the oscillating signal generating device 100, the resistor 1024 is implemented by a transmission gate in this embodiment. When the oscillating circuit 102 operates under the operation mode and the inverter 1026 is under the enable mode, the first control signal EN generated by the control circuit 104 is used to set to close (i.e., switch on) the transmission gate; and when the oscillating circuit 102 operates under the operation mode and the inverter 1026 is under the disable mode, the first control signal EN generated by the control circuit 104 is used to open (i.e., switch off) the transmission gate in order to reduce the current consumption of the resistor 1024. Accordingly, the total current consumption of the oscillating signal generating device 100 can be reduced.

Figure 1B:
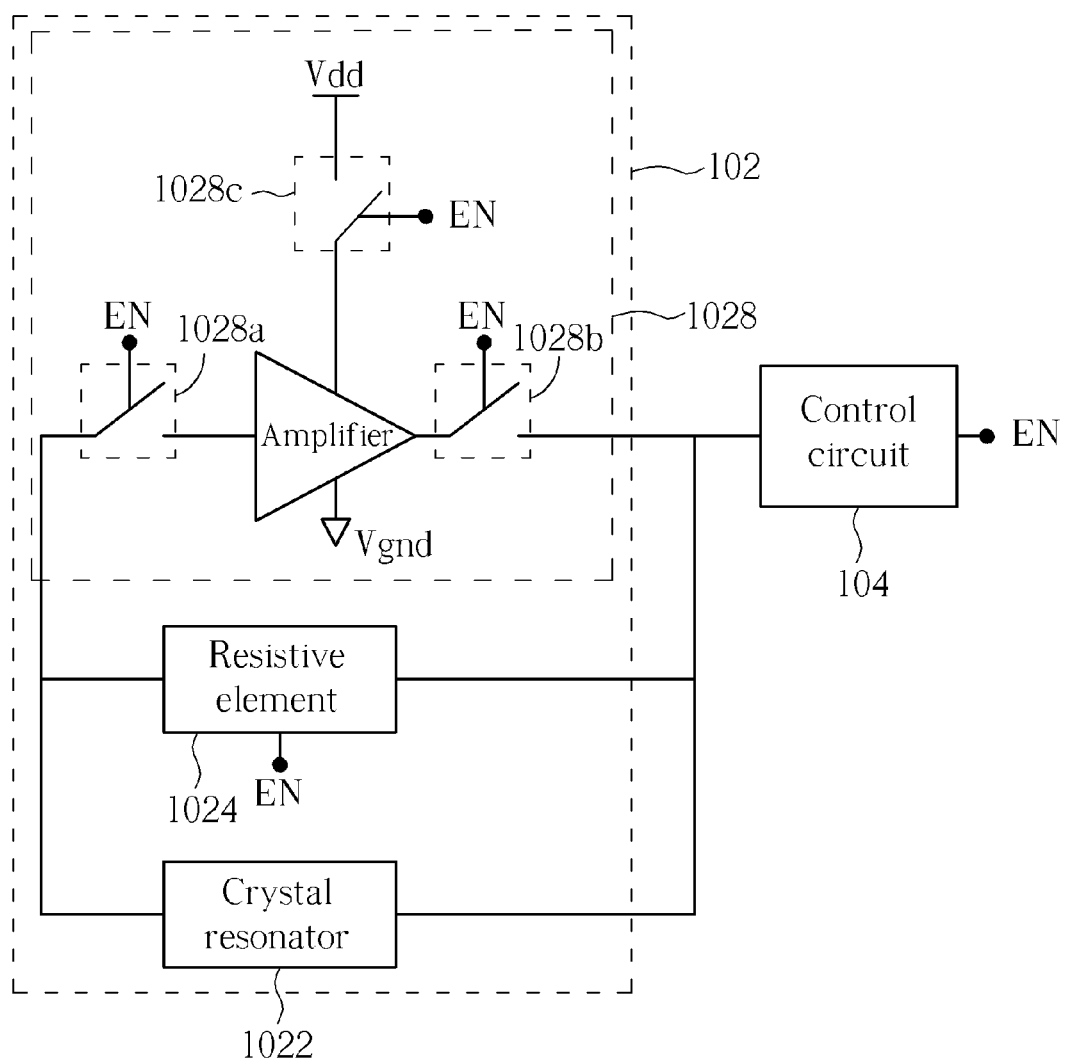
FIG. 1B is a diagram illustrating an oscillating signal generating device according to a second embodiment of the present invention.

FIG. 1B is a diagram illustrating an oscillating signal generating device 100 according to another embodiment of the present invention. Please note that the devices in FIG. 1B having the same numeral as the devices in FIG. 1A also possess similar functions, and therefore the detailed description is omitted here for brevity. In this embodiment, the inverter 1026 in FIG. 1A is replaced by the amplifier 1028 as shown in FIG. 1B. The amplifier 1028 is employed to provide a gain for the oscillating circuit 102 such that the amplifier 1028 in conjunction with the resistor 1024 is able to provide a loop gain larger than 1. Then, the oscillating circuit 102 is able to start oscillating when the oscillating signal generating device 100 is under the operation mode. In other words, the function of the amplifier 1028 in FIG. 1B and the function of the inverter 1026 in FIG. 1A are to start-up the oscillation of the oscillating circuit 102, and therefore the amplifier 1028 in FIG. 1B and the inverter 1026 in FIG. 1A can also be replaced by an oscillating start-up circuit in another embodiment of the present invention, which also has a similar effect to the above-mentioned embodiments. It should be noted that, under some circumstances (e.g., when the oscillating circuit 102 is going to be activated, when the amplitude of the oscillating signal Sout is too small, or when the oscillating start-up circuit has been turned off for a certain time), the control circuit 104 may generate the first control signal EN to close the sixth switch 1028a, the seventh switch 1028b, and the eighth switch 1028c. However, when the oscillating circuit 102 is oscillated, and the amplitude of the oscillating signal Sout is large enough to reach a predetermined amplitude, the control circuit 104 may generate the first control signal EN to open the sixth switch 1028a, the seventh switch 1028b, and the eighth switch 1028c. Then, the amplifier 1028 may not consume any power when the sixth switch 1028a, the seventh switch 1028b, and the eighth switch 1028c are opened.

Figure 2:
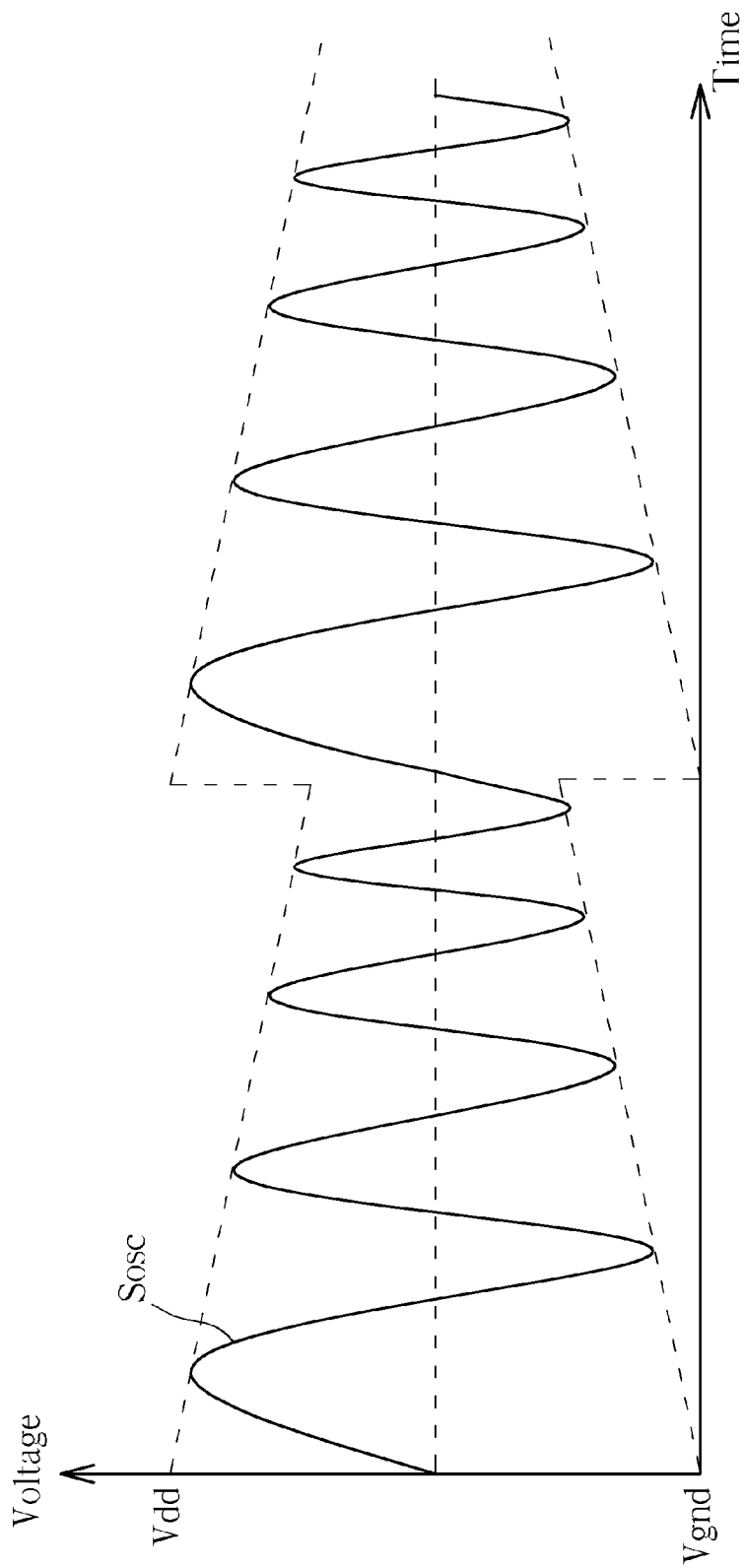
FIG. 2 is a timing diagram illustrating a resonant signal generated by a crystal resonator when an oscillating circuit is under an operation mode and an inverter is under a disable mode.

Please refer to FIG. 2. FIG. 2 is a timing diagram illustrating the resonant signal (i.e., the oscillating signal Sosc) generated by the crystal resonator 1022 when the oscillating circuit 102 is under the operation mode and the inverter 1026 is under the disable mode. As the crystal resonator 1022 is not an ideal lossless oscillator, the energy stored in the crystal resonator 1022 may decrease gradually. In other words, the amplitude (i.e., the peak-to-peak value) of the oscillating signal Sosc decreases as the time passes. When the amplitude of the oscillating signal Sosc reduces to reach a predetermined threshold amplitude or a certain time after the oscillating start-up circuit is activated, the control circuit 104 again changes the inverter 1026 into the enable mode from the disable mode in order to inject power into the crystal resonator 1022. In other words, the oscillating circuit 102 starts to oscillate again when the inverter 1026 is enabled. Then, the amplitude of the oscillating signal Sosc increases gradually until the peak-to-peak value reaches the voltage drop between the supply voltage Vdd and the ground voltage Vgnd. Please note that, even though the control circuit 104 in FIG. 1A is used to receive the oscillating output signal Sout in this embodiment, those skilled in this art may understand that the oscillating signal Sosc generated by the crystal resonator 1022 is the oscillating output signal Sout when the inverter 1026 is disabled.

Figure 3:
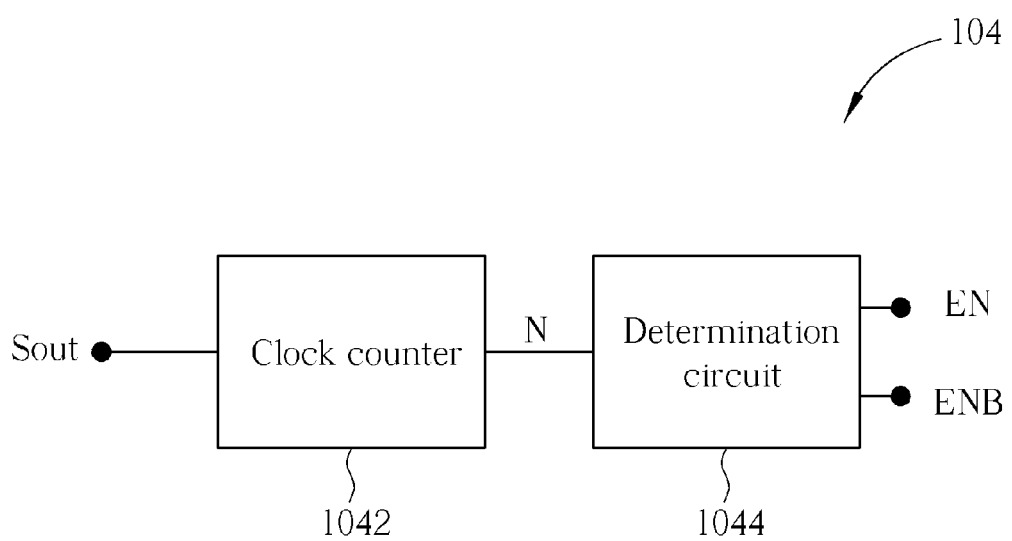
FIG. 3 is a diagram illustrating a control circuit according to an embodiment of the present invention.

Please refer to FIG. 3. FIG. 3 is a diagram illustrating the control circuit 104 according to an embodiment of the present invention. The control circuit 104 comprises a clock counter 1042 and a determination circuit 1044. The clock counter 1042 is employed to count the cycle number of the oscillating output signal Sout to generate a counting result N. The determination circuit 1044 is coupled to the clock counter 1042 for determining if the counting result N reaches a first predetermined cycle number when the oscillating circuit 102 is under the operation mode and when the inverter 1026 is under the enable mode, and the determination circuit 1044 sets the first control signal EN and the second control signal ENB to change the inverter 1026 into the disable mode from the enable mode when the counting result N reaches the first predetermined cycle number. Please note that the smallest number of the first predetermined cycle number can be set to 1. In other words, the control circuit 104 is able to set the first control signal EN and the second control signal ENB to change the inverter 1026 into the disable mode from the enable mode when the control circuit 104 identifies one cycle of the oscillating output signal Sout is generated by the oscillating circuit 102.

When the oscillating circuit 102 is under the operation mode and the inverter 1026 is under the disable mode, the determination circuit 1044 further determines if the counting result N reaches a second predetermined cycle number. Then, the determination circuit 1044 sets the first control signal EN and the second control signal ENB to change the inverter 1026 into the enable mode from the disable mode when the counting result N reaches the second predetermined cycle number.

More specifically, when the oscillating circuit 102 is activated, the clock counter 1042 starts counting the cycle number of the oscillating output signal Sout generated by the oscillating signal generating device 100. When the counting result N reaches the first predetermined cycle number, the determination circuit 1044 sets the first control signal EN and the second control signal ENB to change the inverter 1026 into the disable mode from the enable mode. Afterwards, the clock counter 1042 resets the counting result N and starts re-counting the cycle number of the oscillating signal Sosc (i.e., the resonant signal) generated by the crystal resonator 1022. When the counting result N reaches the second predetermined cycle number, the determination circuit 1044 sets the first control signal EN and the second control signal ENB to change the inverter 1026 into the enable mode from the disable mode. Then, the clock counter 1042 repeats the above-mentioned operation to control the mode of the inverter 1026. Accordingly, the inverter 1026 is under the disable mode during most of the time when the oscillating circuit 102 is under the operation mode, and thus the power consumption of the inverter 1026 is reduced.

Figure 4:
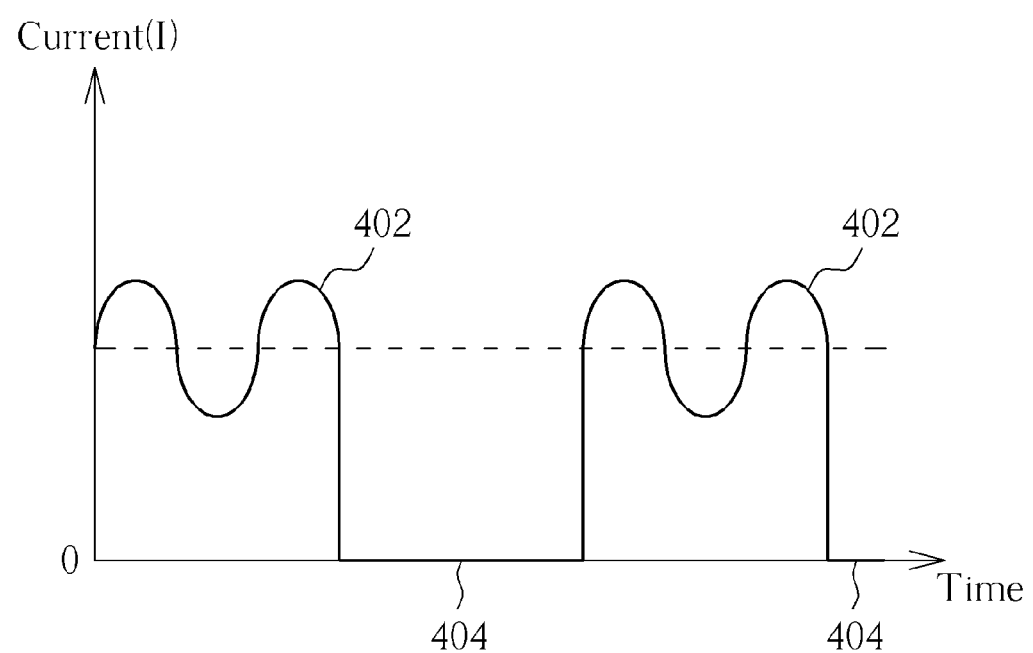
FIG. 4 is a timing diagram illustrating a current passing through a first transistor and a second transistor when an inverter changes between the enable mode and the disable mode.

Please refer to FIG. 4. FIG. 4 is a timing diagram illustrating the current I (i.e., the current consumption of the oscillating circuit 102) passing through the first transistor 1026b and the second transistor 1026f when the inverter 1026 changes between the enable mode and the disable mode. According to FIG. 4, when the inverter 1026 is under the enable mode, the current consumed by the oscillating circuit 102 is represented by the curve 402, where the curve 402 is the current waveform having an average larger than zero. When the inverter 1026 is under the disable mode, current consumed by the oscillating circuit 102 drops to zero, as shown by the curve 404 in FIG. 4. Therefore, when the oscillating circuit 102 is activated, if the total time when the inverter 1026 is under the disable mode is much longer than the total time when the inverter 1026 is under the enable mode, the average current consumption of the oscillating circuit 102 may approximate zero.

Figure 5:
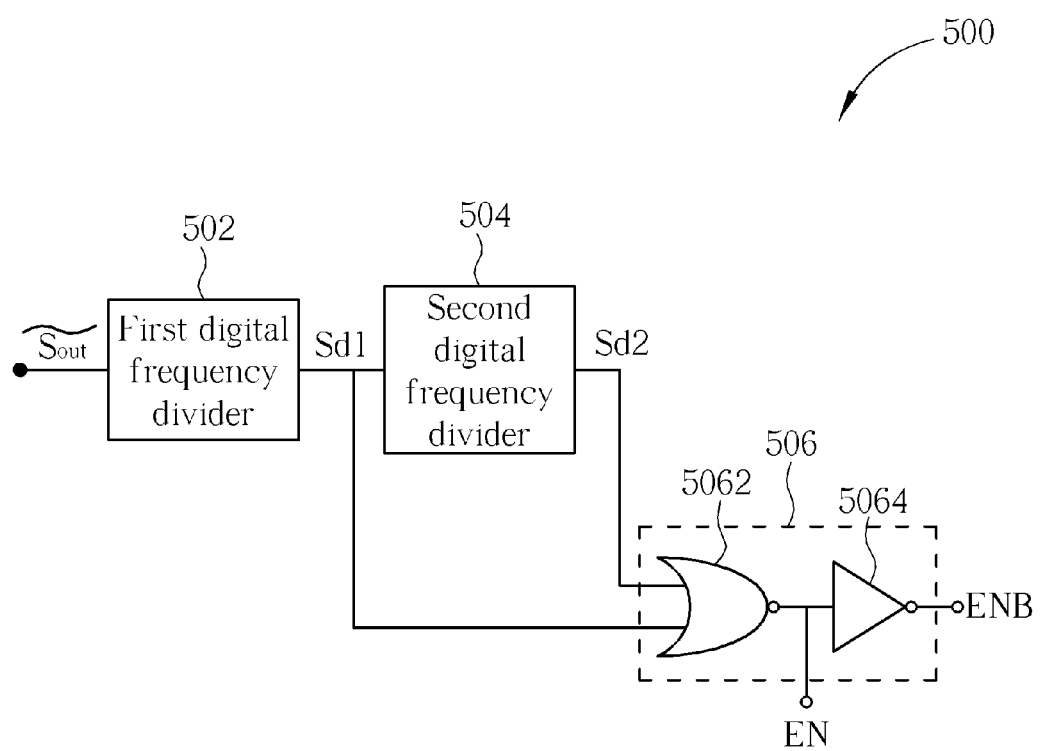
FIG. 5 is a diagram illustrating a control circuit according to a second embodiment of the present invention.

In addition, to further decrease the current consumption of the oscillating signal generating device 10, the present control circuit 104 is implemented as a digital circuit as shown in FIG. 5. FIG. 5 is a diagram illustrating a control circuit 500 according to a second embodiment of the present invention. The control circuit 500 comprises a first digital frequency divider 502, a second digital frequency divider 504, and a logic gate 506. The first digital frequency divider 502 is coupled to the second terminal N2 of the crystal resonator 1022 for performing a frequency dividing operation upon the oscillating output signal Sout to generate a first frequency divided oscillating signal Sd1. The second digital frequency divider 504 is coupled to the first digital frequency divider 502 for performing the frequency dividing operation upon the first frequency divided oscillating signal Sd1 to generate a second frequency divided oscillating signal Sd2. The logic gate 506 comprises a NOR gate 5062 and an inverter 5064. The logic gate 506 is coupled to the first digital frequency divider 502 and the second digital frequency divider 504 for setting the first control signal EN and the second control signal ENB according to the first frequency divided oscillating signal Sd1 and the second frequency divided oscillating signal Sd2. Please note that, when the oscillating circuit 102 is under the operation mode and the inverter 1026 is under the enable mode, the first digital frequency divider 502 performs the frequency dividing operation upon the oscillating output signal Sout to generate the first frequency divided oscillating signal Sd1. When the oscillating circuit 102 is under the operation mode and the inverter 1026 is under the disable mode, the first digital frequency divider 502 performs the frequency dividing operation upon the oscillating signal Sosc to generate the first frequency divided oscillating signal Sd1. Furthermore, the first digital frequency divider 502 and the second digital frequency divider 504 may be implemented by a clock-cycle counter; the detailed circuit is omitted here for brevity.

Figure 6:
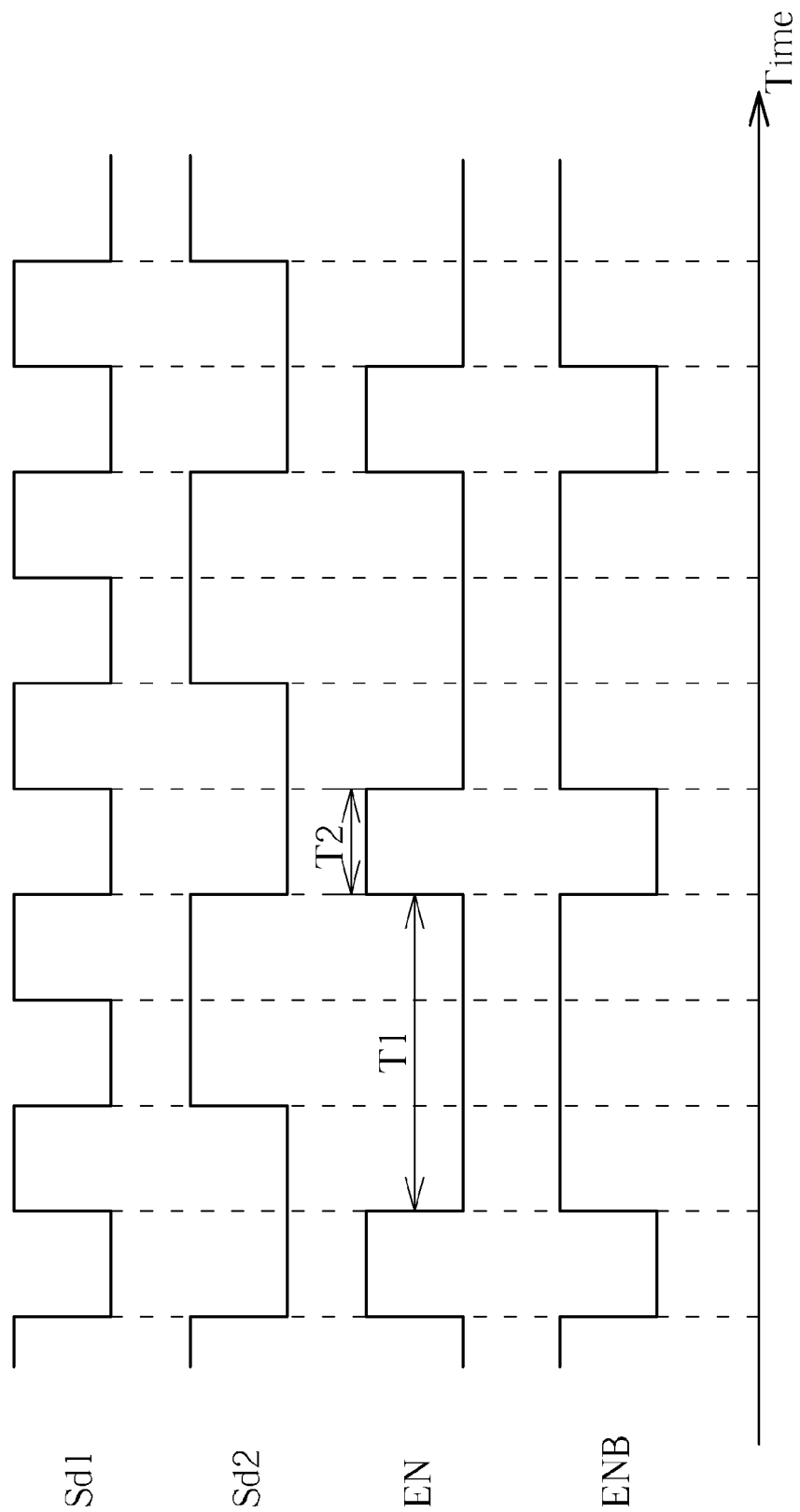
FIG. 6 is a timing diagram illustrating a first frequency divided oscillating signal, a second frequency divided oscillating signal, a first control signal, and a second control signal in the control circuit of FIG. 5 according to an embodiment of the present invention.

In this embodiment, the first digital frequency divider 502 divides the oscillating output signal Sout by a first specific dividend to generate the first frequency divided oscillating signal Sd1, and the second digital frequency divider 504 divides the first frequency divided oscillating signal Sd1 by a second specific dividend (e.g., the second specific dividend is two in this embodiment) to generate the second frequency divided oscillating signal Sd2 as shown in FIG. 6. FIG. 6 is a timing diagram illustrating the first frequency divided oscillating signal Sd1, the second frequency divided oscillating signal Sd2, the first control signal EN, and the second control signal ENB in the control circuit 500 of FIG. 5 according to an embodiment of the present invention. As the oscillating frequency of the first frequency divided oscillating signal Sd1 is double that of the oscillating frequency of the second frequency divided oscillating signal Sd2, the voltage level of the first control signal EN is changed to a high voltage level from a low voltage level in each interval of first time T1. Similarly, the voltage level of the second control signal ENB is changed to the low voltage level from the high voltage level as shown in FIG. 6. Furthermore, the high voltage level of the first control signal EN may be sustained for a second time T2, while the low voltage level of the second control signal ENB may be sustained for a second time T2, wherein the first time T1 is one and a half clock periods of the second frequency divided oscillating signal Sd2, and the second time T2 is one half of the clock period of the first frequency divided oscillating signal Sd1. Therefore, according to the above description, the turn-on time of the first control signal EN and the turn-on time of the second control signal ENB can be set to any time interval by appropriately setting the first specific dividend of the first digital frequency divider 502 and the second specific dividend of the second digital frequency divider 504. More specifically, one feature of this embodiment is to reduce the current consumption of the inverter 1026 via the setting of the first specific dividend of the first digital frequency divider 502 and the second specific dividend of the second digital frequency divider 504.

Please note that one of the objectives of the above-mentioned control circuit 104 and the control circuit 500 is to turn-on and turn-off the inverter 1026 intermittently to save the power consumption of the inverter 1026, wherein the times of turning on and turning off the inverter 1026 may depend on the designer. In this embodiment, the times of turning on and turning off the inverter 1026 are fixed to the predetermined time intervals (i.e., turning on half a clock period and turning off one and a half clock periods in every two clock cycles as shown in FIG. 6), which has the advantages of reducing the complexity of the control circuits 104 and 500. In another embodiment of the present invention, when the inverter 1026 is turned off, the control circuit 104 detects the amplitude of the oscillating signal Sosc to determine if the amplitude is reduced to reach the predetermined threshold amplitude. The control circuit 104 enables the inverter 1026 when the amplitude of the oscillating signal Sosc reduces to reach the predetermined threshold amplitude. When the inverter 1026 is turned on, the control circuit 104 detects the amplitude of the oscillating signal Sosc to determine if the amplitude resumes to a normal amplitude. If the amplitude reaches the normal amplitude, the control circuit 104 disables the inverter 1026. In other words, the control circuit 104 may be implemented by a voltage detecting circuit, such as a peak-to-peak detecting circuit, in another embodiment of the present invention. In this embodiment, when the oscillating circuit 102 is under the operation mode and the inverter 1026 is under the enable mode, the peak-to-peak detecting circuit detects a peak-to-peak value of the oscillating output signal Sout, and sets the first control signal EN and the second control signal ENB to change the inverter 1026 into the disable mode from the enable mode when the peak-to-peak value reaches a first peak-to-peak threshold value. Furthermore, when the oscillating circuit 102 is under the operation mode and the inverter 1026 is under the disable mode, the peak-to-peak detecting circuit also sets the first control signal EN and the second control signal ENB to change the inverter 1026 into the enable mode from the disable mode when the peak-to-peak value is reduced to reach a second peak-to-peak threshold value. By doing this, the peak-to-peak value may increase to return to the first peak-to-peak threshold value. Then, the peak-to-peak detecting circuit repeats the above-mentioned operation to reduce the current consumption of the inverter 1026.

Figure 7:
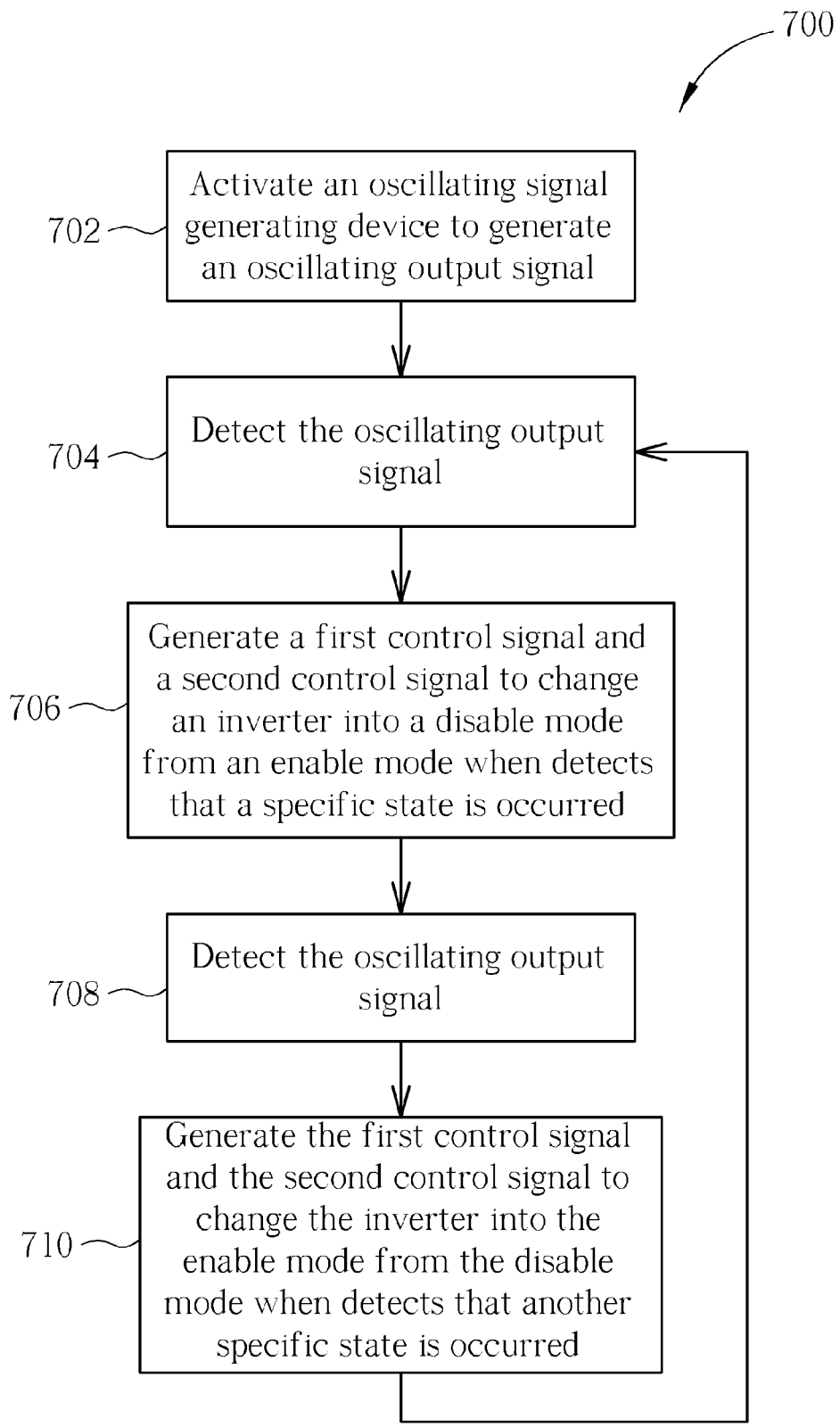
FIG. 7 is a flowchart illustrating an oscillating signal generating method according to an embodiment of the present invention.

Briefly, the above-mentioned oscillating signal generating method can be summarized into the steps shown in FIG. 7. FIG. 7 is a flowchart illustrating an oscillating signal generating method 700 according to an embodiment of the present invention. The oscillating signal generating method 700 can be used to control an oscillator, such as the oscillating circuit 102 as shown in FIG. 1A. Please note that the oscillating signal generating method 700 is described by referencing the oscillating circuit 102 as shown in FIG. 1A for brevity. Provided that substantially the same result is achieved, the steps of the flowchart shown in FIG. 7 need not be in the exact order shown and need not be contiguous; that is, other steps can be intermediate. The oscillating signal generating method 700 comprises the following steps:

Step 702: Activate the oscillating signal generating device 100 to generate the oscillating output signal Sout;

Step 704: Detect the oscillating output signal Sout;

Step 706: Generate the first control signal EN and the second control signal ENB to change the inverter 1026 into the disable mode from the enable mode when it is detected that a specific state occurs;

Step 708: Detect the oscillating output signal Sout;

Step 710: Generate the first control signal EN and the second control signal ENB to change the inverter 1026 into the enable mode from the disable mode when it is detected that another specific state occurs, and go to Step 704.

Please note that the above-mentioned specific state can be a first predetermined time, and the other specific state can be a second predetermined time. Furthermore, the first predetermined time and the second predetermined time can also be replaced by other parameters having similar characteristics, and this also belongs to the scope of the present invention. For example, the above-mentioned Step 704 may also be replaced by detecting a cycle number of the oscillating output signal Sout. When the cycle number reaches a counting result corresponding to the first predetermined time, the inverter 1026 is changed to the disable mode from the enable mode by the first control signal EN and the second control signal ENB in step 706. Similarly, Step 704 may also be replaced by detecting a cycle number of the oscillating output signal Sout. When the cycle number reaches a counting result corresponding to the second predetermined time, the inverter 1026 is changed to the enable mode from the disable mode by the first control signal EN and the second control signal ENB in step 710. Furthermore, Step 704 may also be replaced by detecting a peak-to-peak value of the oscillating output signal Sout, and when the peak-to-peak value reaches a first predetermined peak-to-peak value, the inverter 1026 is changed to the disable mode from the enable mode by the first control signal EN and the second control signal ENB in step 706. Similarly, Step 704 may also be replaced by detecting a peak-to-peak value of the oscillating output signal Sout, and when the peak-to-peak value reaches a second predetermined peak-to-peak value, the inverter 1026 is changed to the enable mode from the disable mode by the first control signal EN and the second control signal ENB in step 710. When Step 710 is completed, the flow goes to Step 704 to repeat the same operation. Accordingly, the current consumption of the inverter 1026 is reduced, and so is the current consumption of the whole chip of the oscillating signal generating device 100.

Briefly, the present oscillating signal generating device 100 turns off the oscillating circuit 102 after the oscillating circuit 102 succeeds in starting up the oscillation in order to save the current consumption of the oscillating circuit 102. Meanwhile, the resonant signal generated by the crystal resonator 1022 is used to output as the oscillating output signal Sout. When the energy of the resonant signal generated by the crystal resonator 1022 reduces to reach a predetermined level, the oscillating circuit 102 will be turned on again. Accordingly, the power consumption of the oscillating signal generating device 100 can be reduced. Furthermore, the size of the present oscillating signal generating device 100 is smaller than the size of a conventional oscillating circuit.

Those skilled in the art will readily observe that numerous modifications and alterations of the device and method may be made while retaining the teachings of the invention.

What is claimed is:

1. An oscillating signal generating device, comprising:
an oscillating circuit, comprising:
    a resonator, having a first terminal and a second terminal, for generating an oscillating signal;
    a resistive element, having a first terminal coupled to the first terminal of the resonator, and a second terminal coupled to the second terminal of the resonator; and
    an oscillating start-up circuit, having an input terminal coupled to the first terminal of the resonator, and an output terminal coupled to the second terminal of the resonator; and
a control circuit, coupled to the resonator, for generating a control signal to change the oscillating start-up circuit into a disable mode from an enable mode when the oscillating circuit generates an oscillating output signal under an operation mode, and outputting the oscillating signal generated by the resonator as the oscillating output signal of the oscillating circuit;
wherein the control circuit comprises:
a peak-to-peak detector, for obtaining an amplitude of the oscillating output signal by detecting a peak-to-peak value of the oscillating output signal when the oscillating circuit is under the operation mode and when the oscillating start-up circuit is under the enable mode, and setting the control signal to change the oscillating start-up circuit into the disable mode from the enable mode when the peak-to-peak value reaches a first peak-to-peak threshold value, wherein no power is injected into the resonator when the oscillating start-up circuit enters the disable mode.

2. The oscillating signal generating device of claim 1, wherein the oscillating start-up circuit operates between a first supply voltage and a second supply voltage, and a conducting path between the oscillating start-up circuit and the first supply voltage or between the oscillating start-up circuit and the second supply voltage is an open-circuit.

3. The oscillating signal generating device of claim 1, wherein the resistive element is a transmission gate, the transmission gate is opened when the oscillating start-up circuit is under the disable mode, and the transmission gate is closed when the oscillating start-up circuit is under the enable mode.

4. The oscillating signal generating device of claim 3, wherein the transmission gate is controlled by the control circuit.

5. The oscillating signal generating device of claim 1, wherein when the oscillating circuit is under the operation mode and when the oscillating start-up circuit is under the disable mode, and when the peak-to-peak value reaches a second peak-to-peak threshold value, the peak-to-peak detector further sets the control signal to change the oscillating start-up circuit into the enable mode from the disable mode.

6. The oscillating signal generating device of claim 1, wherein the control signal comprises a first control signal and a second control signal, and the oscillating start-up circuit comprises:
    a first switch, having a first terminal coupled to the first terminal of the resonator, and a control terminal coupled to the first control signal;
    a first transistor, having a control terminal coupled to a second terminal of the first switch;
    a second switch, having a first terminal coupled to the control terminal of the first transistor, a second terminal coupled to a first supply voltage, and a control terminal coupled to the second control signal;

a first resistive element, having a first terminal coupled to a first output terminal of the first transistor, and a second terminal coupled the first supply voltage;

a third switch, having a first terminal coupled to the first terminal of the resonator, and a control terminal coupled to the first control signal;

a second transistor, having a control terminal coupled to a second terminal of the third switch;

a fourth switch, having a first terminal coupled to the control terminal of the second transistor, a second terminal coupled to a second supply voltage, and a control terminal coupled to the second control signal;

a second resistive element, having a first terminal coupled to a first output terminal of the second transistor; and a fifth switch, having a first terminal coupled to a second terminal of the second resistive element, a second terminal coupled to the second supply voltage, and a control terminal coupled to the first control signal;

wherein a second output terminal of the first transistor is coupled to a second output terminal of the second transistor, and is coupled to the second terminal of the resonator.

7. The oscillating signal generating device of claim 1, wherein the oscillating start-up circuit comprises:

a first switch, having a first terminal coupled to the first terminal of the resonator, and a control terminal coupled to the control signal;

an amplifier, having an input terminal coupled to a second terminal of the first switch;

a second switch, having a first terminal coupled to a first supply voltage, a second terminal coupled to the amplifier, and a control terminal coupled to the control signal; and a third switch, having a first terminal coupled to an output terminal of the amplifier, a second terminal coupled to the second terminal of the resonator, and a control terminal coupled to the control signal;

wherein the amplifier provides a gain for the oscillating circuit such that the amplifier in conjunction with the resistive element provide a loop gain larger than 1.

8. An oscillating signal generating method, for controlling an oscillating circuit, wherein the oscillating circuit comprises:

an oscillating start-up circuit, for starting an oscillation of the oscillating circuit;

the oscillating signal generating method comprises:

generating a control signal to change the oscillating start-up circuit into a disable mode from an enable mode when the oscillating circuit generates an oscillating output signal under an operation mode; and outputting an oscillating signal generated by a resonator as the oscillating output signal of the oscillating circuit when the oscillating start-up circuit is under the disable mode;

wherein the step of generating the control signal to change the oscillating start-up circuit into the disable mode from the enable mode comprises:

obtaining an amplitude of the oscillating output signal by detecting a peak-to-peak value of the oscillating output signal when the oscillating circuit is under the operation mode and when the oscillating start-up circuit is under the enable mode; and setting the control signal to change the oscillating start-up circuit into the disable mode from the enable mode when the peak-to-peak value reaches a first peak-to-peak threshold value, wherein no power is injected into the resonator when the oscillating start-up circuit enters the disable mode.

9. The oscillating signal generating method of claim 8, wherein the oscillating start-up circuit operates between a first supply voltage and a second supply voltage, and the step of generating the control signal to change the oscillating start-up circuit into the disable mode from the enable mode comprises:

opening a conducting path between the oscillating start-up circuit and the first supply voltage or between the oscillating start-up circuit and the second supply voltage.

10. The oscillating signal generating method of claim 8, wherein the resistive element is a transmission gate, and the step of generating the control signal to change the oscillating start-up circuit into the disable mode from the enable mode comprises:

opening the transmission gate when the oscillating start-up circuit is under the disable mode; and closing the transmission gate when the oscillating start-up circuit is under the enable mode.

11. The oscillating signal generating method of claim 8, wherein when the oscillating circuit is under the operation mode and when the oscillating start-up circuit is under the disable mode, the step of generating the control signal to change the oscillating start-up circuit into the disable mode from the enable mode further comprises:

setting the control signal to change the oscillating start-up circuit into the enable mode from the disable mode when the peak-to-peak value reaches a second peak-to-peak threshold value.

12. The oscillating signal generating method of claim 8, wherein when the oscillating circuit is under the operation mode and when the oscillating start-up circuit is under the disable mode, the method further comprises:

detecting the oscillating signal; and generating the control signal to change the oscillating start-up circuit into the enable mode from the disable mode when it is detected that the oscillating signal conforms to a specific state.

* * * * *